United States Patent
Dammasch et al.

(10) Patent No.: US 10,077,498 B2
(45) Date of Patent: Sep. 18, 2018

(54) METHOD FOR DEPOSITING A COPPER SEED LAYER ONTO A BARRIER LAYER AND COPPER PLATING BATH

(71) Applicant: Atotech Deutschland GmbH, Berlin (DE)

(72) Inventors: Matthias Dammasch, Berlin (DE); Marco Haryono, Berlin (DE); Sengül Karasahin, Berlin (DE); Hans-Jürgen Schreier, Velten (DE)

(73) Assignee: Atotech Deutschland GmbH, Berlin (DE)

( * ) Notice: Subject to any disclaimer, the term of this patent is extended or adjusted under 35 U.S.C. 154(b) by 56 days.

(21) Appl. No.: 14/906,370

(22) PCT Filed: Sep. 11, 2014

(86) PCT No.: PCT/EP2014/069410
§ 371 (c)(1),
(2) Date: Jan. 20, 2016

(87) PCT Pub. No.: WO2015/043975
PCT Pub. Date: Apr. 2, 2015

(65) Prior Publication Data
US 2016/0194760 A1 Jul. 7, 2016

(30) Foreign Application Priority Data

Sep. 25, 2013 (EP) ..................... 13185862

(51) Int. Cl.
| | | |
|---|---|---|
| *B05D 3/10* | (2006.01) | |
| *C23C 18/40* | (2006.01) | |
| *C23C 18/16* | (2006.01) | |
| *H01L 21/288* | (2006.01) | |
| *H01L 21/768* | (2006.01) | |
| *C25D 3/38* | (2006.01) | |
| *C25D 5/00* | (2006.01) | |
| *C25D 7/12* | (2006.01) | |

(52) U.S. Cl.
CPC .......... *C23C 18/40* (2013.01); *C23C 18/1633* (2013.01); *C23C 18/1653* (2013.01); *C23C 18/1683* (2013.01); *C25D 3/38* (2013.01); *C25D 5/00* (2013.01); *C25D 7/12* (2013.01); *H01L 21/288* (2013.01); *H01L 21/76873* (2013.01); *H01L 21/76898* (2013.01)

(58) Field of Classification Search
CPC ......... C23C 18/31; C23C 18/38; C23C 18/40; C23C 18/405; C23C 18/1633; C23C 18/1635; C23C 18/1637; C23C 18/1642; C23C 18/166
USPC .... 427/304, 305, 306, 97.9, 98.1, 99.5, 437, 427/443.1
See application file for complete search history.

(56) References Cited

U.S. PATENT DOCUMENTS

| | | | |
|---|---|---|---|
| 3,075,855 A | | 1/1963 | Agens |
| 3,993,491 A | * | 11/1976 | Feldstein ............... C23C 18/208 106/1.11 |
| 4,152,467 A | * | 5/1979 | Alpaugh ................. C23C 18/40 106/1.26 |
| 5,240,497 A | | 8/1993 | Shacham et al. |
| 5,543,182 A | | 8/1996 | Joshi et al. |
| 6,824,665 B2 | | 11/2004 | Shelnut et al. |
| 2004/0152303 A1 | | 8/2004 | Verbunt |
| 2010/0075496 A1 | * | 3/2010 | Chen ................. H01L 21/02068 438/653 |
| 2016/0194760 A1 | | 7/2016 | Dammasch et al. |

FOREIGN PATENT DOCUMENTS

| | | |
|---|---|---|
| CN | 101899708 | 12/2010 |
| TW | I614373 | 2/2018 |

OTHER PUBLICATIONS

PCT/EP2014/069410; PCT International Search Report and Written Opinion of the International Searching Authority dated Dec. 12, 2014.
Search Report for corresponding Taiwanese Application No. 106143094 dated Jun. 11, 2018.

* cited by examiner

*Primary Examiner* — Dah-Wei D. Yuan
*Assistant Examiner* — Nga Leung V Law
(74) *Attorney, Agent, or Firm* — Renner, Otto, Boisselle & Sklar, LLP

(57) ABSTRACT

The present invention relates to a method for providing a copper seed layer on top of a barrier layer wherein said seed layer is deposited onto said barrier layer from an aqueous electroless copper plating bath comprising a water-soluble source for Cu(II) ions, a reducing agent for Cu(II) ions, at least one complexing agent for Cu(II) ions and at least one source for hydroxide ions selected from the group consisting of RbOH, CsOH and mixtures thereof. The resulting copper seed layer has a homogeneous thickness distribution and a smooth outer surface which are both desired properties.

24 Claims, 14 Drawing Sheets

METHOD FOR DEPOSITING A COPPER SEED LAYER ONTO A BARRIER LAYER AND COPPER PLATING BATH

The present application is a U.S. National Stage Application based on and claiming benefit and priority under 35 U.S.C. § 371 of International Application No. PCT/EP2014/069410, filed 11 Sep. 2014, which in turn claims benefit of and priority to European Application No. 13185862.3 filed 25 Sep. 2013, the entirety of both of which is hereby incorporated herein by reference.

FIELD OF THE INVENTION

The present invention relates to a method for depositing a copper seed layer onto a barrier layer which serves as a plating base for successive electroplating. The method according to the present invention is particularly suitable for dual damascene plating in the manufacture of microchips and the like.

BACKGROUND OF THE INVENTION

Electroplating of a metal, particularly copper electroplating, requires an electrically conductive seed layer in case of substrate surfaces made of typical barrier materials such as ruthenium and cobalt. Such a seed layer can in principle consist of any kind of electrically conductive material. However, copper seed layers are preferred because of the high intrinsic electrical conductivity of copper.

Said seed layer has to fulfil several requirements such as a sufficient adhesion to the underlying barrier layer and to the metal deposited on top of said seed layer by electroplating. Furthermore, the seed layer should have a homogeneous (narrow) thickness distribution and a smooth outer surface. Such requirements are of particular importance in the manufacture of microchips and the like, where recessed structures which need to be coated with such a copper seed layer can have dimensions as low as in the nanometer range.

Methods for plating a copper seed layer onto a barrier layer made of ruthenium are disclosed in U.S. Pat. No. 7,998,859 B2 and U.S. Pat. No. 7,470,617 B2. Both methods utilize an aqueous solution comprising a reducing agent to remove undesired surface oxides from the ruthenium barrier layer prior to electroless copper plating. Both methods further utilize standard electroless copper plating bath composition comprising either NaOH of KOH as the sole source for hydroxide ions. The roughness of the outer surface of the copper seed layer in both cases is too high (comparative Examples 1 to 4).

Accordingly, there is a need to provide a thin copper layer deposited by electroless plating onto a barrier layer which results in a copper seed layer having an outer surface with an improved smoothness.

OBJECTIVE OF THE PRESENT INVENTION

It is the objective of the present invention to provide a method for depositing a copper seed layer for successive electroplating onto a barrier layer which has a homogeneous thickness distribution and a smooth outer surface.

SUMMARY OF THE INVENTION

This objective is solved by a method for providing a copper seed layer on top of a barrier layer comprising, in this order, the steps of (i) providing a substrate comprising at least on a portion of the outer surface a barrier layer,
(ii) contacting said substrate with an aqueous electroless copper plating bath which comprises
   a. a water-soluble source for Cu(II) ions,
   b. a reducing agent for Cu(II) ions,
   c. at least one complexing agent for Cu(II) ions and
   d. at least one source for hydroxide ions selected from the group consisting of RbOH, CsOH and mixtures thereof.

The copper seed layer on top of a barrier layer obtained by the method according to the present invention provides a sufficient adhesion to the underlying barrier layer and the metal layer electroplated onto said copper seed layer. Furthermore, the copper seed layer has a homogeneous thickness distribution and the required smooth surface. No activation of the barrier layer with a noble metal activator is required prior to depositing the copper seed layer by electroless plating thereon.

DETAILED DESCRIPTION OF THE INVENTION

Figure 1:
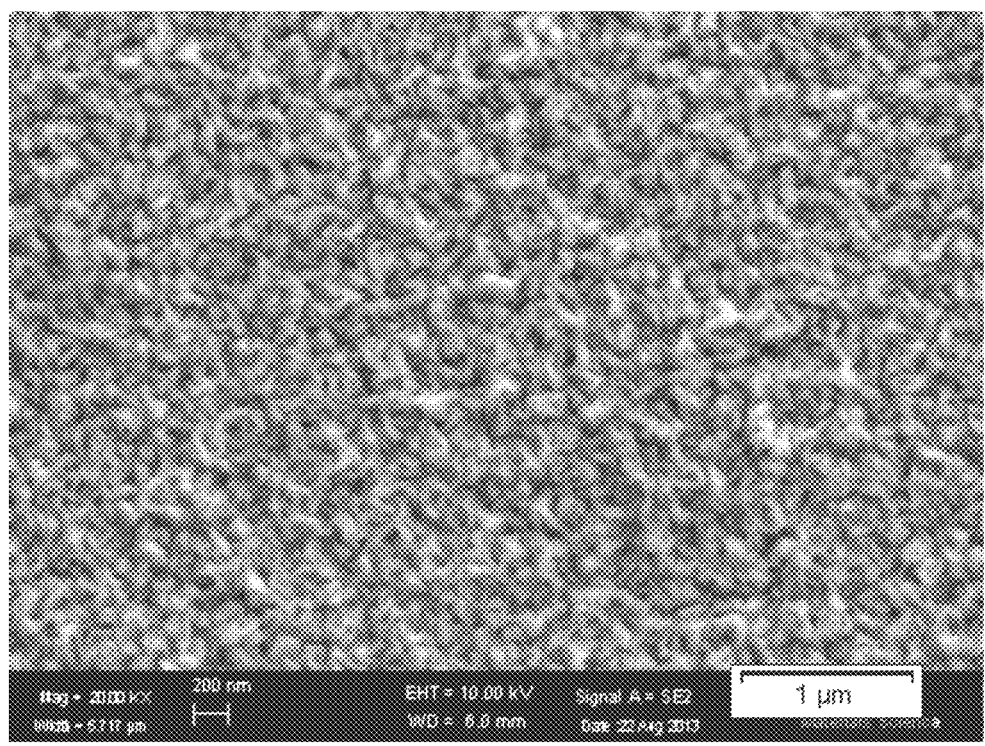
FIG. 1 shows a scanning electron micrograph of a copper seed layer obtained from an electroless plating bath containing NaOH as the sole source for hydroxide ions and glyoxylic acid as the reducing agent on a ruthenium barrier layer (Example 1 (comparative)).

The substrate material suitable for the method for providing a copper seed layer on top of a barrier layer according to the present invention is preferably selected from silicon, a low-κ-dielectric material on a silicon substrate and glass. Electronic devices made of such materials comprise microchips, glass interposers and the like. Recessed structures in such substrate materials need to be coated or filled with a metal which is usually deposited by electroplating. The most relevant metal is electroplated copper.

One particular application of the method for providing a copper seed layer on top of a barrier layer according to the present invention is electroplating a metal into very fine recessed structures etched into a silicon substrate, a low-κ-dielectric material on a silicon substrate. Typical low-κ-dielectric materials are known in the art and comprise fluorine-doped silicon dioxide, carbon-doped silicon dioxide, porous silicon dioxide, porous carbon-doped silicon dioxide, polyimide, polynorbornenes, benzocyclobutane, PTFE and spin-on silicone based polymeric dielectrics such as hydrogen-silsesquioxane and methylsilsesquioxane.

Such very fine recessed structures can be blind vias (only having one opening), through vias (having an opening on both sides) as well as trenches (line patterns and the like). Such recessed structures usually have geometric dimensions ranging from e.g. 14 nm to several hundred µm or even mm.

This particular application can be divided in
1. dual-damascene applications wherein the recessed structures are formed in silicon and/or a low-κ-dielectric material and having an opening size in the nanometer or low micrometer range. The copper seed layer may have a thickness in the range of 1 to 20 nm and
2. filling of through silicon vias (TSVs) which are blind vias in silicon and/or a low-κ-dielectric material on a silicon substrate. The opening of TSVs is in the micrometer range and the copper seed layer may have a thickness up to several hundred nanometers or even one or more micrometer.

Another particular application of copper seed layers on top of a barrier layer is in the manufacture of displays such as liquid crystal based displays wherein a glass substrate is coated with one or more metallic barrier layers. Electrical circuitry may be formed by depositing a copper seed layer having a smooth outer surface onto the one or more barrier layers followed by electroplating of a metal such as copper thereon.

All of these applications require a homogeneous thickness distribution of the copper seed layer and a smooth outer surface.

Undesired diffusion and related processes of said electroplated metal into the substrate material or vice versa must be suppressed in many cases in order to obtain and/or maintain the desired properties of the final electronic device. Accordingly, the electroplated metal is separated by means of one or more barrier layers deposited by either gas phase methods such as chemical vapour deposition (CVD), physical vapour deposition (PVD) and atomic layer deposition (ALD) and plasma-enhanced methods of the aforementioned, or wet chemical processes such as electroless plating. Only the most outer barrier layer in case of a stack of two or more individual barrier layer materials will be in contact with the electroless copper plating bath. The single barrier layer material or most outer barrier layer material in case of stacks of two or more individual barrier layers is selected from cobalt nickel, ruthenium, tungsten, molybdenum, tantalum, titanium, iridium, rhodium and alloys of the aforementioned.

Said "alloys of the aforementioned" comprises nitrides such as tungsten nitride, tantalum nitride and cobalt nitrides such as $Co_4N$ as well as phosphides and borides such as cobalt- and nickel-phosphorous or -boron alloys, ternary cobalt- and nickel-phosphorous alloys and ternary cobalt- and nickel-boron alloys (e.g. Ni—Mo—P, Ni—W—P, Co—Mo—P, Co—W—P, Co—W—B).

The thickness of said barrier layer or the outermost barrier layer in case of a stack of several barrier layers usually has a thickness in the range of 1 to 20 nm.

Removal of Undesired Surface Oxides from the Barrier Layer:

In case the single barrier layer material or outermost barrier layer material in case of stacks of individual barrier layers is a ruthenium layer, surface oxides present on top of the outer surface of said barrier layer materials may need to be removed prior to depositing the copper seed layer by electroless plating because they may prevent a full coverage of the copper seed layer on the whole outer surface of said barrier layer.

Said surface oxides can be sufficiently removed prior to step (ii) by treatment of a ruthenium surface with e.g. a $N_2/H_2$ plasma and/or by treatment of the ruthenium surface with a reducing agent provided in a solvent.

Wet-Chemical Removal of Undesired Surface Oxides from the Barrier Layer:

Suitable reducing agents in a solvent for a sufficient removal of said surface oxides are selected from the group comprising glyoxylic acid, formaldehyde, hypophosphite, hydrazine, dimethylamino borane, trimethylamine borano, N-methylmorpholino borane and sodium borhydride. The concentration of said reducing agent in the solvent preferably ranges from 0.001 to 10 mol/l, more preferably from 0.005 to 5 mol/l and most preferably from 0.01 to 2 mol/l.

The solvent is preferably selected from the group comprising water, alcohols such as i-propanole, glycol ethers such as diethyleneglycol and mixtures thereof. Mixtures of water and one or more of the aforementioned organic solvents preferably comprise 50 wt.-% water and more preferably less than 50 wt.-% water. The stability of the reducing agent is improved when utilizing said water-(organic)solvent instead of pure water or water-(organic)solvent mixtures containing more than 50 wt.-% water.

The substrate having a ruthenium barrier layer is preferably contacted with said reducing agent in a solvent for 30 s to 20 min and more preferably for 1 to 10 min. The temperature of the reducing agent-solvent mixture during said process step is preferably held in a range from 20 to 90° C. and more preferably 50 to 90° C.

Said reducing agent-solvent mixture preferably comprises a wetting agent such as a cationic wetting agent, an anionic wetting agent, a non-ionic wetting agent, an amphoteric wetting agent and mixtures thereof. Such types of wetting agents are for example disclosed in U.S. Pat. No. 7,998,859 B2.

The concentration of the wetting agent in the reducing agent-solvent mixture preferably ranges from 0.1 to 100 g/l, more preferably 0.25 to 25 g/l and most preferably 0.5 to 15 g/l.

Another suitable wet-chemical method for a sufficient removal of undesired surface oxides on the outer surface of a ruthenium barrier layer is the treatment of the ruthenium barrier layer with nascent hydrogen which is generated in situ in a solvent by applying a cathodic current to the substrate which is contacted with said solvent. In this embodiment, nascent hydrogen serves as the reducing agent provided in a solvent.

The voltage applied to the substrate preferably ranges from 0.5 to 20 V, more preferably 1 to 15 V and most preferably from 2 to 10 V and is held for 1 to 360 s, more preferably for 10 to 180 s and most preferably for 20 to 120 s. The solvent is preferably selected from the group comprising water, alcohols such as i-propanole, glycol ethers such as diethyleneglycol, and mixtures thereof.

The solvent containing in situ formed nascent hydrogen is held during this process step at a temperature in the range of 10 to 80° C., more preferably of 15 to 60° C. and most preferably of 20 to 40° C.

The solvent preferably comprises a wetting agent selected from cationic wetting agents, anionic wetting agents, non-ionic wetting agents, amphoteric wetting agents, and mixtures thereof. More preferably, the solvent comprises a non-ionic wetting agent or mixtures of two or more non-ionic wetting agents. Most preferably, the solvent comprises a non-ionic wetting agent selected from the group comprising polyethyleneglycol, polypropyleneglycol, polyethyleneglycol-polypropyleneglycol co-polymers, alcohol alkoxylates such as branched secondary alcohol ethoxylates and ethoxylated phenol or naphtol, alkoxylated fatty acid such as ethoxylated fatty acids and mixtures thereof. The desired removal of surface oxides with the nascent hydrogen as the reducing agent is particularly supported by said non-ionic wetting agents.

The concentration of the wetting agent in the solvent or of all wetting agents together in case more than one wetting agent is utilized preferably ranges from 0.5 to 100 g/l, more preferably from 1 to 25 g/l and most preferably from 5 to 15 g/l.

In one embodiment of the present invention two or more of said means for reducing surface oxides on top of a ruthenium barrier layer are combined. A rinsing step with a rinsing liquid e.g. with water may separate said means for reducing surface oxides prior to step (ii). The rinsing liquid may further comprise a non-ionic wetting agent preferably selected from the group comprising polyethyleneglycol, polypropyleneglycol, polyethyleneglycol-polypropyleneglycol co-polymers, alcohol alkoxylates such as branched secondary alcohol ethoxylates and ethoxylated phenol or naphtol, alkoxylated fatty acid such as ethoxylated fatty acids and mixtures thereof.

The concentration of the optional non-ionic wetting agent in the rinsing liquid or of all wetting agents together in case more than one non-ionic wetting agent is utilized preferably ranges from 0.5 to 100 g/l, more preferably from 1 to 25 g/l and most preferably from 5 to 15 g/l.

The substrate may be rinsed for example with water prior to step (ii) of the method according to the present invention.

Barrier layer materials which are not suitable for depositing a copper layer by electroless (autocatalytic) plating thereon require a separate activation prior to step (ii) of the method according to the present invention. Said activation is known in the art and for example used in the manufacture of printed circuit boards and the like. Accordingly, barrier layer materials which are not suitable for depositing a copper layer by electroless (autocatalytic) plating thereon can for example be activated by depositing a noble metal such as palladium by immersion plating onto said barrier layer material which is then suited for depositing copper by electroless (autocatalytic) plating thereon.

Electroless Plating of the Copper Seed Layer onto the Barrier Layer:

One particular drawback of such barrier layer(s) is their electrical conductivity which is usually much lower than e.g. the electrical conductivity of copper. Accordingly, a copper seed layer having an increased electrical conductivity in comparison with barrier layer materials is required for successive electroplating.

The thickness of said copper seed layer preferably ranges from 50 nm to 2 µm for applications such as filling of through silicon vias and manufacture of displays. In case of dual damascene applications, the thickness of the copper seed layer preferably ranges from 1 to 20 nm.

The copper seed layer is deposited by electroless plating onto the barrier layer (or the outermost barrier layer in case of a stack of two or more individual barrier layers) in step (ii) of the method according to the present invention. "Electroless plating" means "autocatalytic plating". Hence, the copper plating bath utilized in step (ii) comprises a reducing agent for Cu(II) ions.

The electroless copper plating bath utilized in the method according to the present invention is preferably an aqueous plating bath, i.e., the solvent is water.

The water-soluble source for Cu(II) ions is preferably selected from the group comprising copper sulfate, copper chloride, copper nitrate, copper acetate, copper methane sulfonate, copper hydroxide, copper formate and hydrates thereof. The concentration of Cu(II) ions in the electroless plating bath preferably ranges from 0.05 to 20 g/l, more preferably from 0.1 to 10 g/l and most preferably from 0.2 to 6 g/l.

The electroless plating bath further contains a reducing agent selected from the group comprising formaldehyde, glyoxylic acid, glucose, sucrose, cellulose, sorbitol, mannitol, gluconolactone, hypophosphite, boranes, hydrazine, formic acid, ascorbic acid and mixtures thereof. Most preferably, the reducing agent is glyoxylic acid. The concentration of the reducing agent preferably ranges from 0.1 to 100 g/l, more preferably from 0.5 to 50 g/l and most preferably from 1 to 20 g/l.

The electroless plating bath further comprises at least one complexing agent for Cu(II) ions which is preferably selected from the group comprising carboxylic acids, hydroxycarboxylic acids, aminocarboxylic acids, alkanolamines, polyols and mixtures thereof.

Particularly preferred combinations of a reducing agent and at least one complexing agent for Cu(II) ions are:

1. glyoxylic acid as reducing agent and at least one polyamino disuccinic acid derivative as the complexing agent for Cu(II) ions which is disclosed in WO 2013/050332 A2;

2. glyoxylic acid as reducing agent and a combination of i) at least one polyamino disuccinic acid derivative and ii) one or more compounds selected from the group consisting of ethylenediamine tetraacetic acid, N'-(2-Hydroxyethyl)-ethylenediamine-N,N,N'-triacetic and N,N,N',N'-Tetrakis-(2-hydroxypropyl)-ethylenediamine as complexing agents for Cu(II) ions which is disclosed in EP 13161330.9; and 3. glyoxylic acid as reducing agent and a combination of i) N,N,N',N'-tetrakis-(2-hydroxypropyl)ethylenediamine and ii) one or more from ethylenediamine tetraacetic acid, and N'-(2-Hydroxyethyl)-ethylenediamine-N,N,N'-triacetic acid as complexing agents for Cu(II) ions which is disclosed in EP 13161418.

The electroless plating bath further comprises a source for hydroxide ions which is selected from the group consisting of RbOH, CsOH and mixtures thereof. The concentration of hydroxide ions is adjusted to obtain a pH-value for the electroless copper plating bath which preferably ranges between 10 and 14 and more preferably between 11 and 13.5.

The electroless plating bath according to the present invention and utilized in the method for providing a copper seed layer on top of a barrier layer is most preferably substantially free of $Na^+$ and $K^+$ ions. "Substantially free of" is defined herein as not intentionally or purposefully added to the electroless plating bath. It is possible that there is some small quantity of $Na^+$ and/or $K^+$ impurity present, but this is neither sought nor desired.

The electroless plating bath according to the present invention and utilized in the method for providing a copper seed layer on top of a barrier layer is also most preferably substantially free of tetraalkylammonium ions such as tetramethylammonium ions.

In another embodiment of the present invention, said electroless plating bath comprises $Na^+$ and/or $K^+$ ions in addition to the at least one source for hydroxide ions selected from the group consisting of RbOH, CsOH and mixtures thereof. Accordingly, hydroxide ions may be provided in this embodiment of the present invention in the form of at least 50 mol-% hydroxide ions provided by sources selected from the group consisting of RbOH, CsOH and mixtures thereof, and less than 50 mol-% hydroxide ions are provided by adding NaOH and/or KOH to said electroless plating bath. Hydroxide ions may also be provided completely in this embodiment of the present invention by a source for hydroxide ions selected from the group consisting of RbOH, CsOH and mixtures thereof, and $Na^+$ and/or $K^+$ ions are added to said electroless plating bath in form of e.g. the sodium and/or potassium salt of a carboxylic acid, hydroxycarboxylic acid and/or aminocarboxylic acid as the complexing agent for Cu(II) ions.

The electroless plating bath utilized in step (ii) of the method according to the present invention is preferably free of $Na^+$ and $K^+$ ions which are utilized as counter ions in the source of hydroxide ions in commercially used electroless plating baths for deposition of copper.

The roughness of the outer surface of the copper seed layer is too high when using NaOH or KOH as the sole source of hydroxide ions (Examples 1 to 4). The roughness of the outer surface of the copper seed layer is also too high when using tetramethylammonium hydroxide or tetrabutylammonium hydroxide as the sole source of hydroxide ions (Examples 8 and 9)

The electroless plating bath optionally further comprises at least one stabilizing agent which suppresses undesired reduction of copper in the plating bath itself. The at least one stabilizing agent is preferably selected from the group comprising mercaptobenzothiazole, thiourea, cyanide and/or ferrocyanide, cobaltocyanide salts, polyethyleneglycol derivatives, 2,2'-bipyridyl, methyl butynol and propionitrile.

The concentration of the at least one stabilizing agent preferably ranges from 0.1 to 1000 mg/l, more preferably from 0.5 to 500 mg/l and most preferably from 1 to 250 mg/l.

In a preferred embodiment of the present invention, the electroless plating bath further comprises a wetting agent selected from the group comprising cationic wetting agents, anionic wetting agents, non-ionic wetting agents, amphoteric wetting agents and mixtures thereof.

Most preferably, the electroless plating bath comprises one or more non-ionic wetting agents selected from the group comprising polyethyleneglycol, polypropyleneglycol, polyethyleneglycol-polypropyleneglycol co-polymers, alcohol alkoxylates such as branched secondary alcohol ethoxylates and ethoxylated phenol or naphtol, alkoxylated fatty acid such as ethoxylated fatty acids and mixtures thereof. Particularly said non-ionic wetting agents reduce the plating rate during electroless copper plating onto the barrier layer. Thereby, the thickness distribution of the copper seed layer on top of the barrier layer is improved, i.e. more homogeneous.

The concentration of the optional wetting agent (or in case of a mixture of two or more wetting agents the concentration of all wetting agents together) preferably ranges from 0.1 to 100 g/l, more preferably from 0.25 to 25 g/l and most preferably from 0.5 to 15 g/l.

The substrate can be for example contacted with the electroless plating bath by dipping the substrate into the electroless plating bath, by spraying the electroless plating bath onto the substrate and by dispensing the electroless copper plating bath onto the substrate. A particularly suitable plating tool which can be used to carry out the method according to the present invention is disclosed in US 2012/0213914 A1.

The electroless plating bath is preferably held at a temperature in the range of 15 to 80° C., more preferably 20 to 60° C. and most preferably 25 to 45° C. during step (ii). The substrate is contacted with the electroless plating bath during step (ii) for 5 s to 30 min, depending on the desired thickness of the copper seed layer to be deposited and on the plating rate obtained by the particular plating bath composition and plating parameters.

In one embodiment of the present invention, an inert gas is directed through the electroless plating bath during step (ii) which increases the plating rate. The inert gas is preferably selected from nitrogen, argon and mixtures thereof.

The life time of the electroless plating bath for depositing the copper seed layer is improved by directing oxygen gas through the electrolyte before step (ii) and/or between plating steps (ii) in production.

Preferably, oxygen gas is directed through the electrolyte before step (ii) and/or between plating steps (ii) in production, and/or an inert gas is directed through the electroless plating bath during step (ii).

The copper seed layer deposited in step (ii) has a homogeneous thickness distribution even at a thickness of e.g. 10 nm or even less. Hence, the barrier layer is completely covered by the copper seed layer even if the copper seed layer only has a thickness of e.g. 10 nm or even less.

Furthermore, the outer surface of the copper seed layer is smooth as desired. The smoothness expressed in $S_Q$ values and obtained for electroless copper plating at 35° C. for 22 min with glyoxylic acid as the reducing agent preferably ranges from 0.1 to 4 nm, more preferably 0.2 to 3.9 nm and most preferably from 0.5 to 3.8 nm.

The smoothness expressed in $S_Q$ values obtained for electroless copper plating at 35° C. for 22 min with formaldehyde as the reducing agent preferably ranges from 0.1 to 30 nm, more preferably from 1 to 28 nm and most preferably from 5 to 26 nm.

The "$S_Q$ value" is defined herein as the root mean square height of the surface.

Said $S_Q$ value can be obtained by scanning the outer surface of the copper seed layer with a scanning atomic force microscope. Such methods and their application to determine the smoothness of a metal surface and the respective $S_Q$ value are known in the art.

The smoothness of copper seed layers obtained from an electroless copper plating bath comprising formaldehyde as the reducing agent is less good than compared to electroless copper plating baths comprising glyoxylic acid as the reducing agent. The technical effect of the at least one source for hydroxide ions selected from the group consisting of RbOH, CsOH and mixtures thereof is also observed with formaldehyde as the reducing agent.

The substrate is then suited for depositing a metal onto the copper seed layer by electroplating.

The method for providing a copper seed layer on top of a barrier layer is also suitable for filling recessed structures such as dual damascene structures completely with copper instead of only providing a seed layer for successive electroplating of a metal such as copper thereon. A recessed structure filled with a copper deposit is obtained from this embodiment of the present invention.

The metal which is deposited by electroplating onto the copper seed layer can be in principle any metal or metal alloy which can be electroplated onto a copper seed layer. Most preferably, the metal which is deposited by electroplating onto the copper seed layer is copper. Suitable bath compositions and plating conditions for depositing a metal such as copper or a metal alloy onto the copper seed layer are known in the art.

EXAMPLES

The invention will now be further illustrated by reference to the following non-limiting examples.
General Procedures
Substrate Materials:

The substrate material in case of Examples 1 to 2, 4 to 6, 8 and 9 was silicon in form of wafers having a ruthenium barrier layer attached to the wafer surface whereon copper was deposited by electroless plating after reduction of surface oxides and activation with a noble metal catalyst.

The substrate material in case of Examples 3 and 7 was silicon in form of wafers having a cobalt barrier layer attached to the wafer surface whereon copper was deposited by electroless plating without reduction of surface oxides and activation with a noble metal catalyst.

Reduction of Surface Oxides on Ruthenium as the Barrier Layer Material:

The wet-chemical pre-treatment method consisted of dipping the substrate comprising a ruthenium barrier layer into a solution consisting of 2 g/l of dimethylamino borane as the reducing agent in diethylene glycol as the solvent (T=65° C., t=2 min).
Electroless Copper Plating Baths:

Two different electroless copper plating bath types were used. The first type of copper plating bath comprised glyoxylic acid as the reducing agent and an alkanolamine as complexing agent. The second type of copper plating bath comprised formaldehyde as the reducing agent and tartrate as complexing agent.

Different sources of hydroxide ions were added throughout the examples in order to obtain a pH value of 13 in the copper plating baths of both types.

The plating baths were held during copper deposition at 35° C. and the plating time was 22 min.
Investigation of the Surface Smoothness of the Copper Seed Layers:

The smoothness of the outer surface of the copper seed layers was determined with a scanning atomic force microscope (Digital Instruments, NanoScope equipped with a PointProbe® from Nanosensors with a tip radius of less than 7 nm), scan size: 1×1 µm (glyoxylic acid-based plating baths) and 5×5 µm (formaldehyde-based plating baths), scan in tapping mode.

$S_Q$ values were obtained by these measurements and are provided with the respective example below.

Example 1 (Comparative)

Copper was deposited onto a silicon wafer comprising a ruthenium barrier layer after reduction of the surface oxides. The sole source of hydroxide ions in the copper plating bath was NaOH and the reducing agent was glyoxylic acid.

A scanning electron micrograph of the copper seed layer outer surface is shown in FIG. 1.

Figure 2:
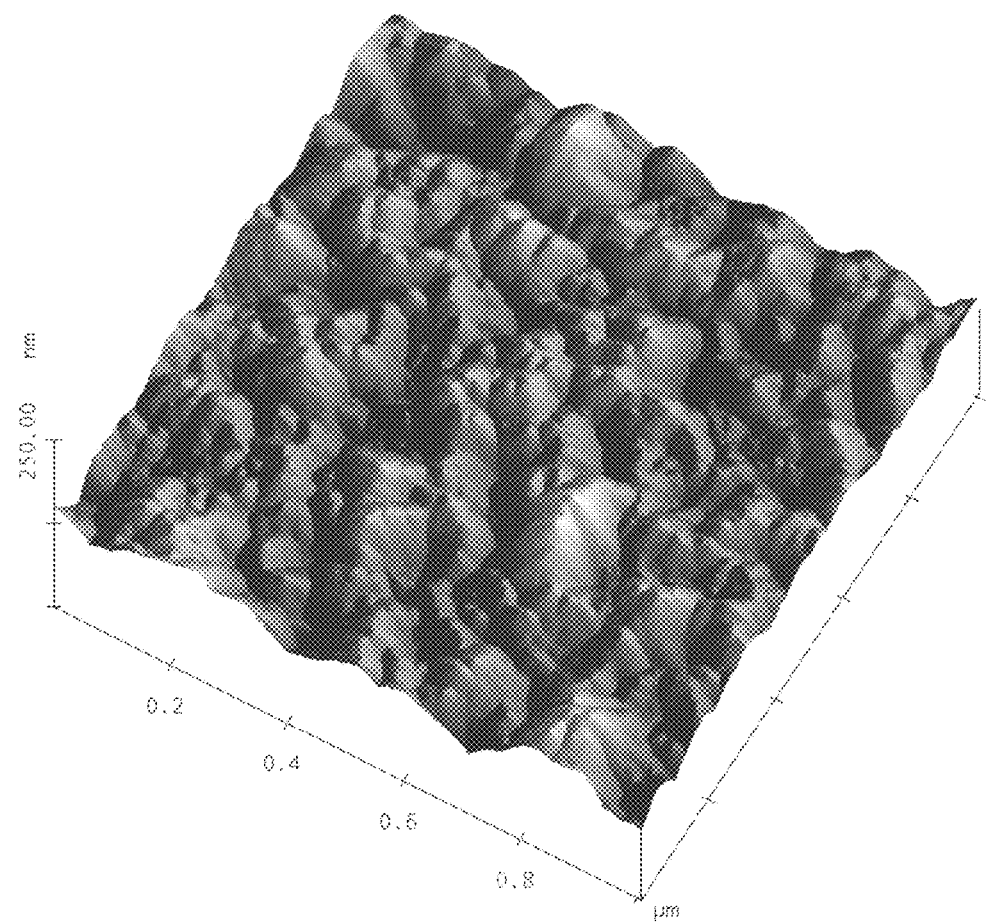
FIG. 2 shows a scanning atomic force microscope (AFM) image of a copper seed layer obtained from an electroless plating bath containing NaOH as the sole source for hydroxide ions and glyoxylic acid as the reducing agent on a ruthenium barrier layer (Example 1 (comparative)).

The $S_Q$ value obtained was 11.71 nm from the scanning atomic force microscope scan shown in FIG. 2.

Example 2 (Comparative)

Copper was deposited onto a silicon wafer comprising a ruthenium barrier layer after reduction of the surface oxides. The sole source of hydroxide ions in the copper plating bath was NaOH and the reducing agent was formaldehyde.

Figure 3:
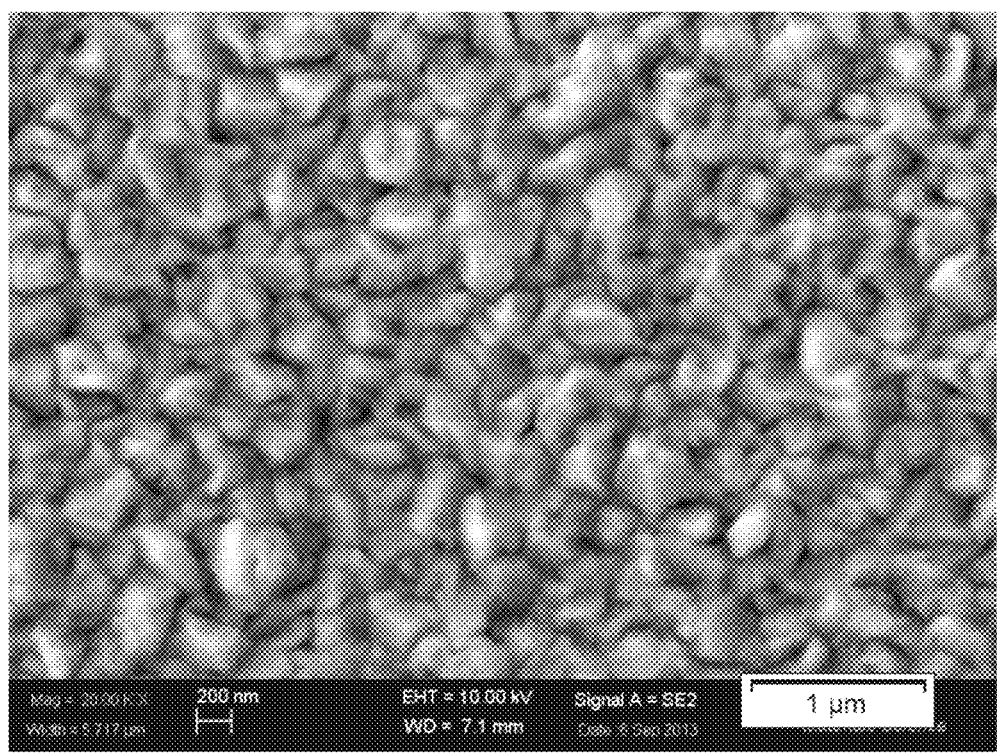
FIG. 3 shows a scanning electron micrograph of a copper seed layer obtained from an electroless plating bath containing NaOH as the sole source for hydroxide ions and formaldehyde as the reducing agent on a ruthenium barrier layer (Example 2 (comparative)).

A scanning electron micrograph of the copper seed layer outer surface is shown in FIG. 3.

Figure 4:
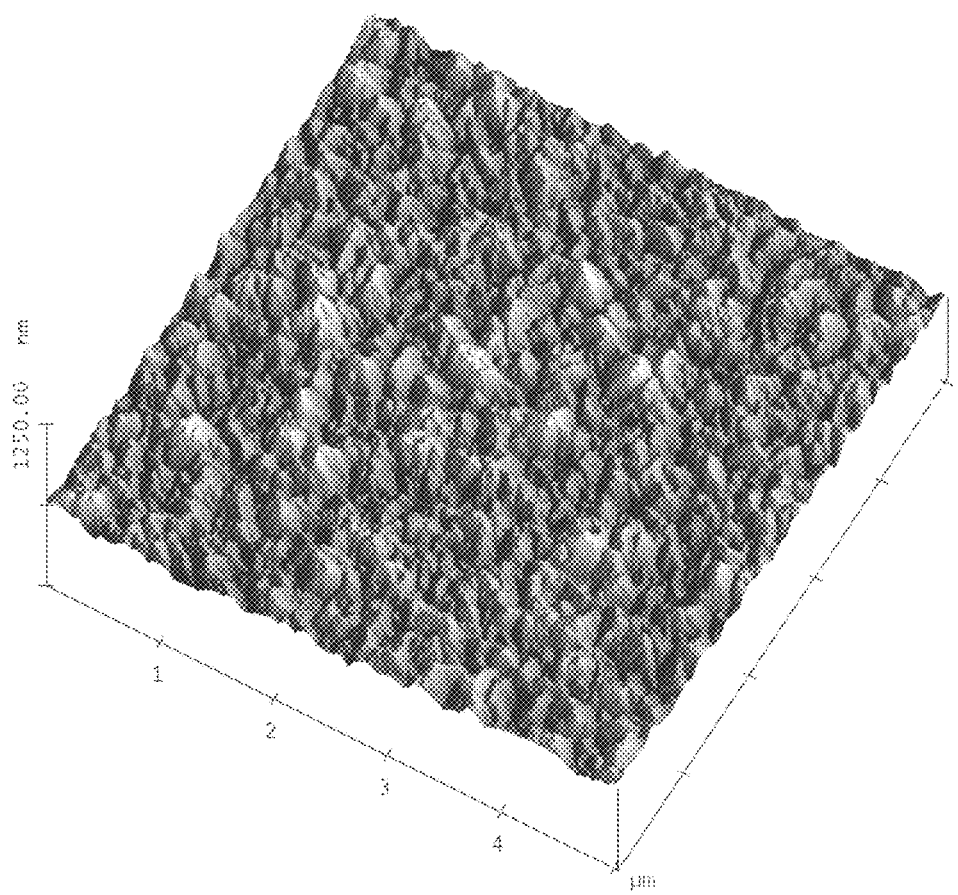
FIG. 4 shows a scanning atomic force microscope (AFM) image of a copper seed layer obtained from an electroless plating bath containing NaOH as the sole source for hydroxide ions and formaldehyde as the reducing agent on a ruthenium barrier layer (Example 2 (comparative)).

The $S_Q$ value obtained was 31.4 nm from the scanning atomic force microscope scan shown in FIG. 4.

Example 3 (Comparative)

Copper was deposited onto a silicon wafer comprising a cobalt barrier layer after reduction of the surface oxides. The sole source of hydroxide ions in the copper plating bath was NaOH and the reducing agent was glyoxylic acid.

Figure 5:
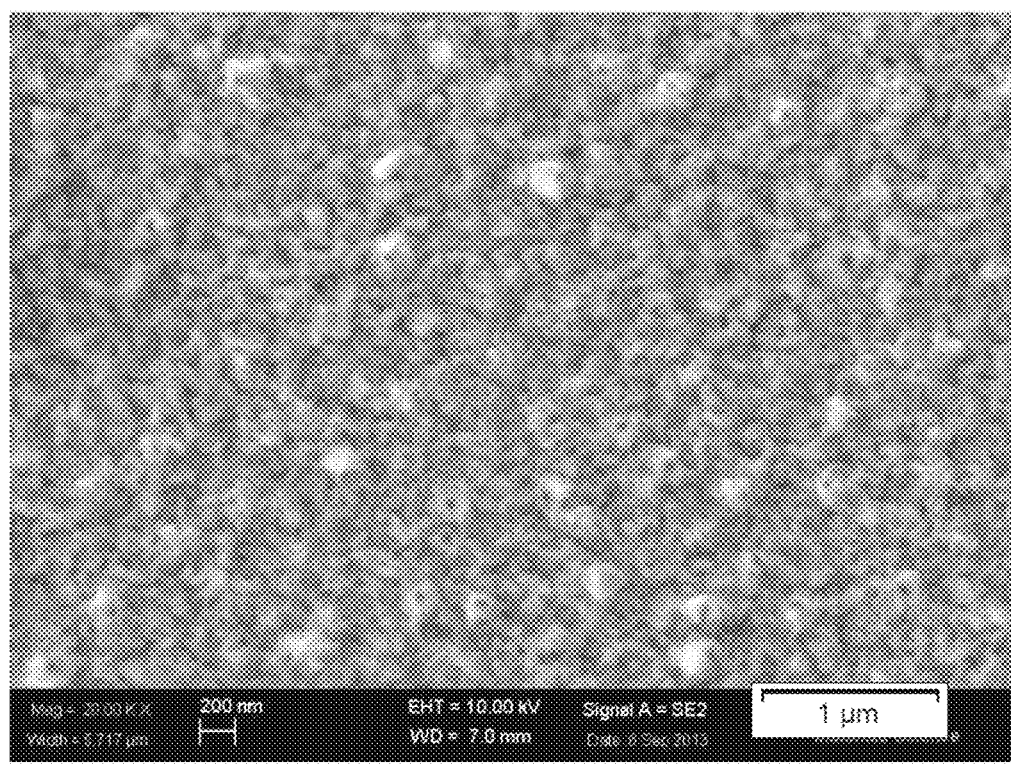
FIG. 5 shows a scanning electron micrograph of a copper seed layer obtained from an electroless plating bath containing NaOH as the sole source for hydroxide ions and glyoxylic acid as the reducing agent on a cobalt barrier layer (Example 3 (comparative)).

A scanning electron micrograph of the copper seed layer outer surface is shown in FIG. 5.

Example 4 (Comparative)

Copper was deposited onto a silicon wafer comprising a ruthenium barrier layer after reduction of the surface oxides.

The sole source of hydroxide ions in the copper plating bath was KOH and the reducing agent was formaldehyde.

Figure 6:
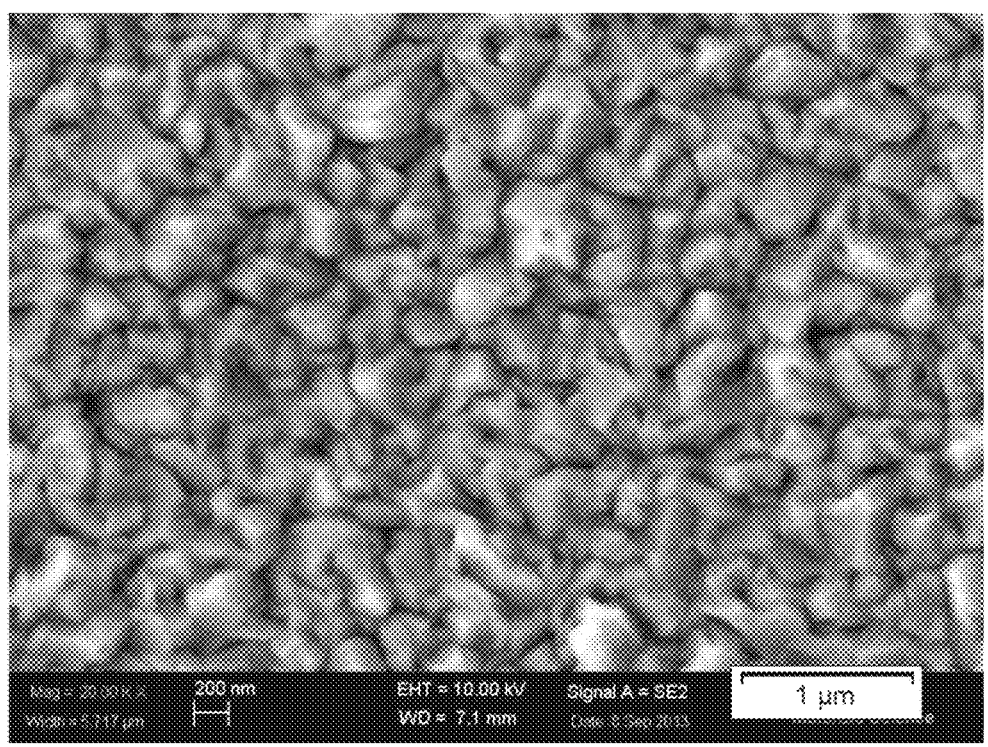
FIG. 6 shows a scanning electron micrograph of a copper seed layer obtained from an electroless plating bath containing KOH as the sole source for hydroxide ions and formaldehyde as the reducing agent on a ruthenium barrier layer (Example 4 (comparative)).

A scanning electron micrograph of the copper seed layer outer surface is shown in FIG. 6.

Figure 7:
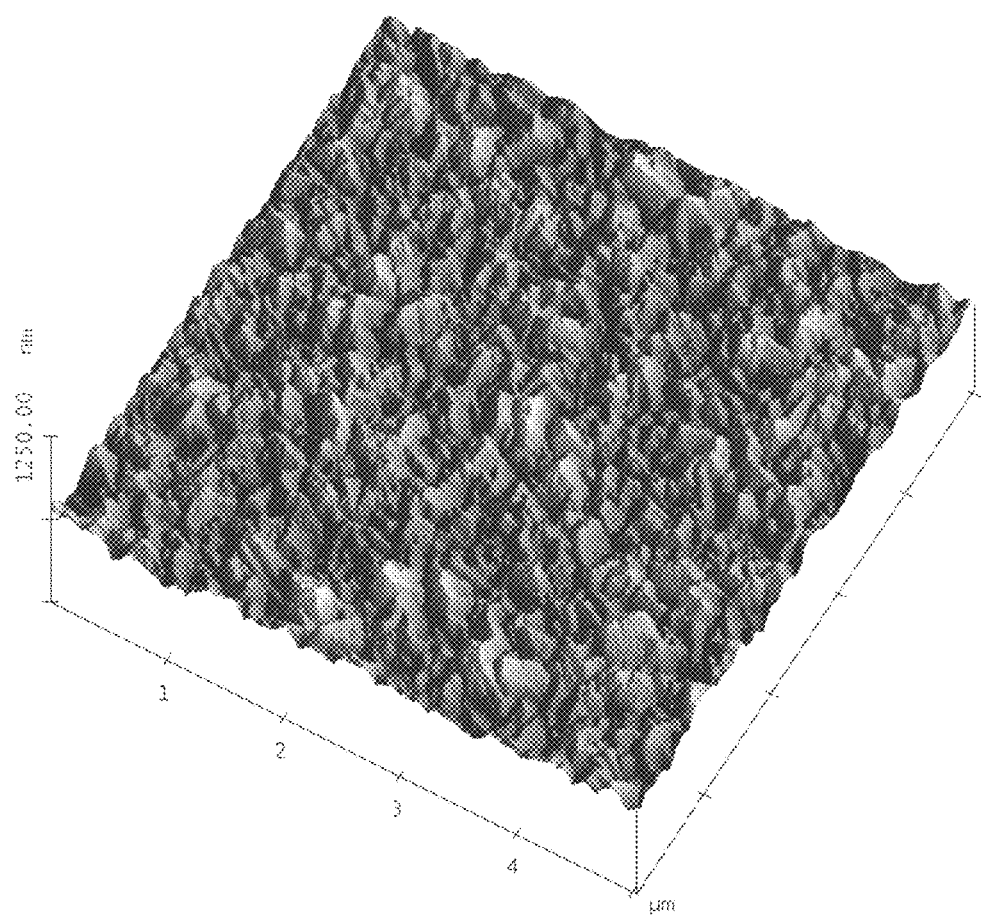
FIG. 7 shows a scanning atomic force microscope (AFM) image of a copper seed layer obtained from an electroless plating bath containing KOH as the sole source for hydroxide ions and formaldehyde as the reducing agent on a ruthenium barrier layer (Example 4 (comparative)).

The $S_Q$ value obtained was 33.5 nm from the scanning atomic force microscope scan shown in FIG. 7.

Example 5 (Invention)

Copper was deposited onto a silicon wafer comprising a ruthenium barrier layer after reduction of the surface oxides. The sole source of hydroxide ions in the copper plating bath was CsOH and the reducing agent was glyoxylic acid.

Figure 8:
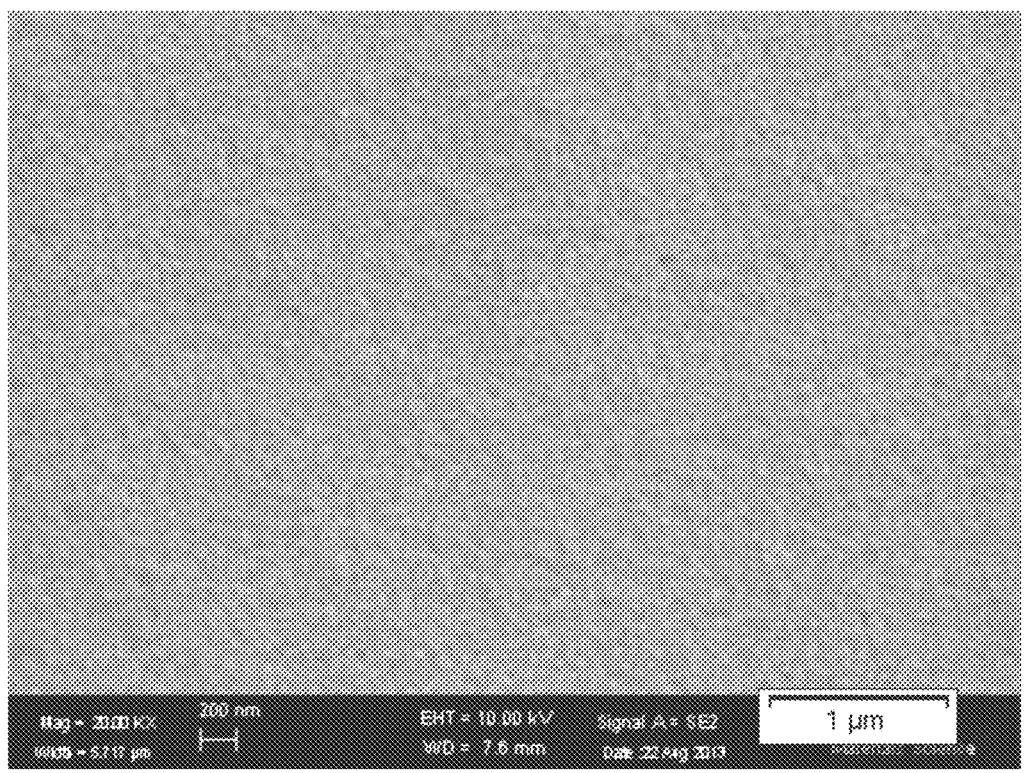
FIG. 8 shows a scanning electron micrograph of a copper seed layer obtained from an electroless plating bath containing CsOH as the sole source for hydroxide ions and glyoxylic acid as the reducing agent on a ruthenium barrier layer (Example 5 (invention)).

A scanning electron micrograph of the copper seed layer outer surface is shown in FIG. 8.

Figure 9:
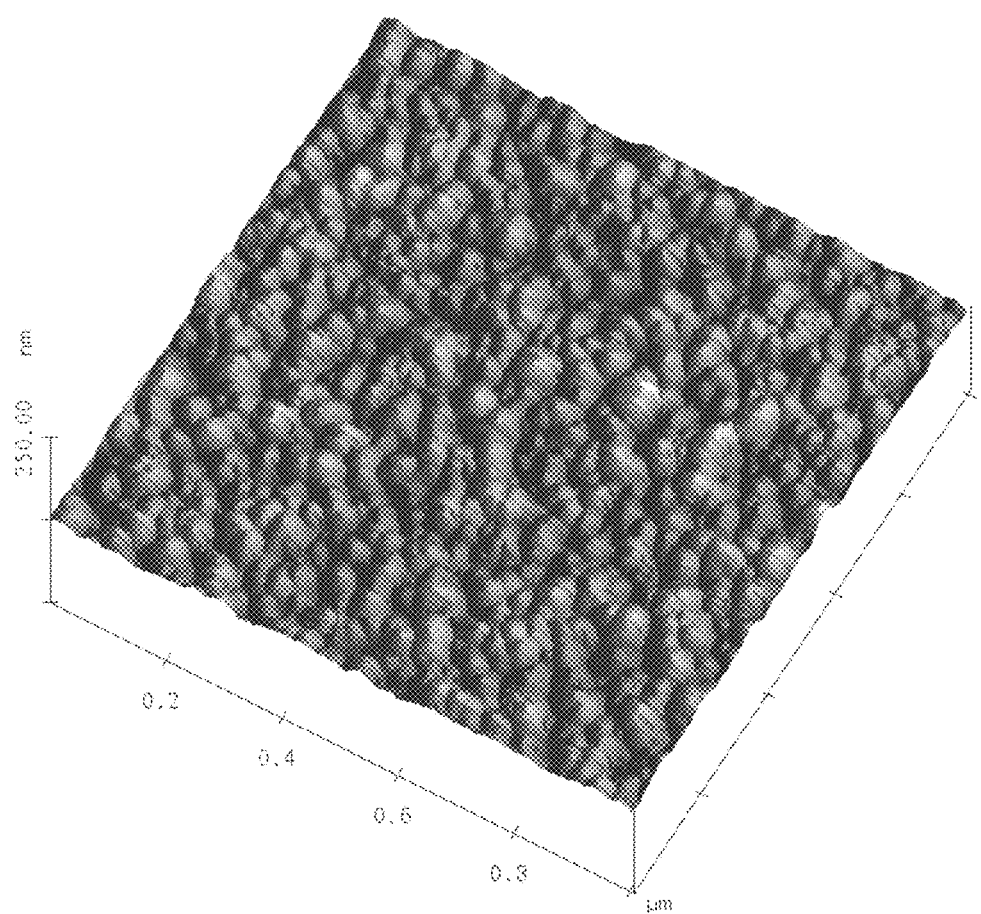
FIG. 9 shows a scanning atomic force microscope (AFM) image of a copper seed layer obtained from an electroless plating bath containing CsOH as the sole source for hydroxide ions and glyoxylic acid as the reducing agent on a ruthenium barrier layer (Example 5 (invention)).

The $S_Q$ value obtained was 3.67 nm from the scanning atomic force microscope scan shown in FIG. 9.

Example 6 (Invention)

Copper was deposited onto a silicon wafer comprising a ruthenium barrier layer after reduction of the surface oxides. The sole source of hydroxide ions in the copper plating bath was CsOH and the reducing agent was formaldehyde.

Figure 10:
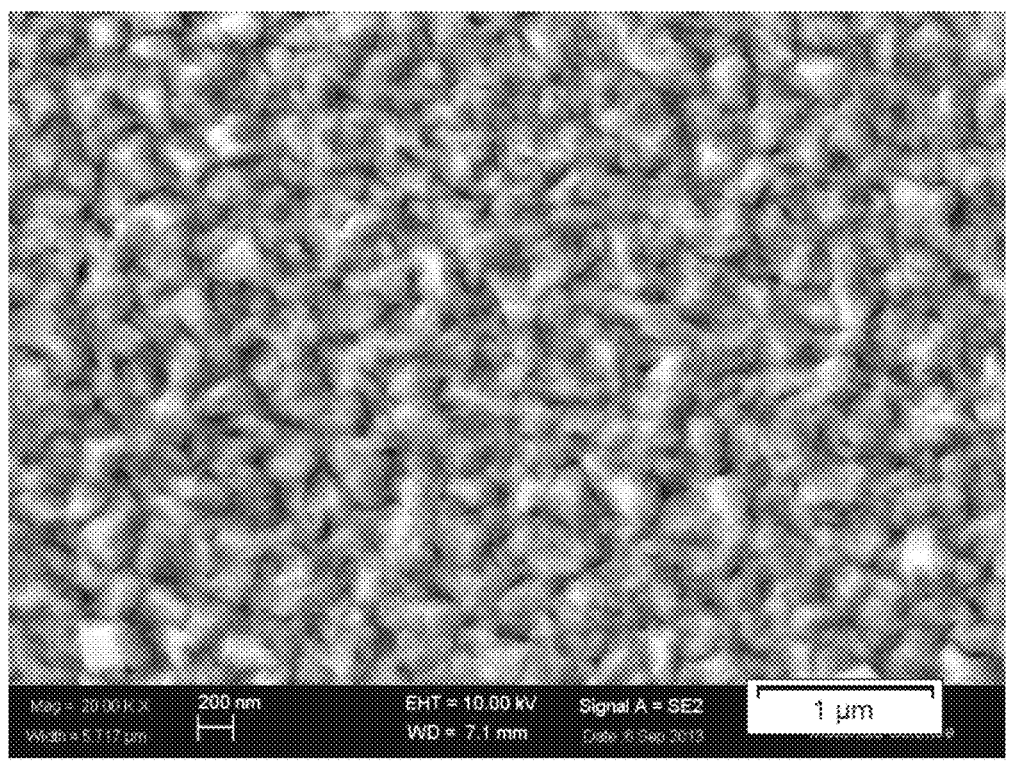
FIG. 10 shows a scanning electron micrograph of a copper seed layer obtained from an electroless plating bath containing CsOH as the sole source for hydroxide ions and formaldehyde as the reducing agent on a ruthenium barrier layer (Example 6 (invention)).

A scanning electron micrograph of the copper seed layer outer surface is shown in FIG. 10.

Figure 11:
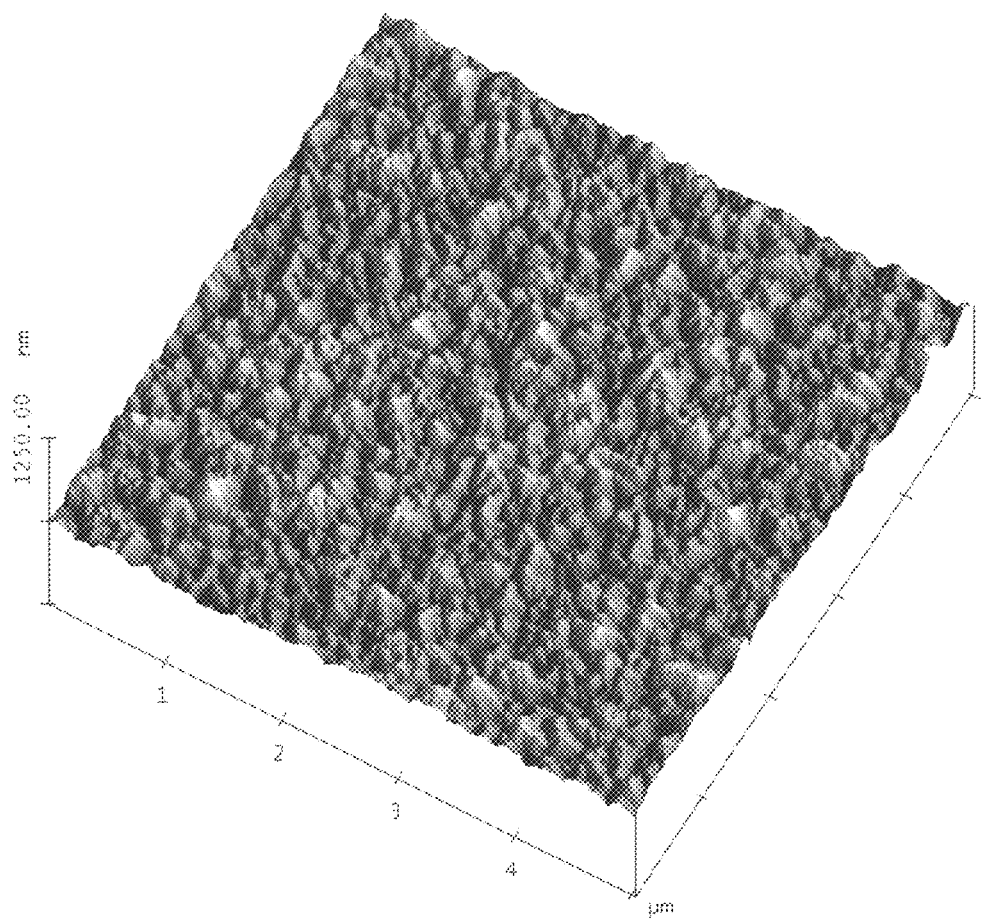
FIG. 11 shows a scanning atomic force microscope (AFM) image of a copper seed layer obtained from an electroless plating bath containing CsOH as the sole source for hydroxide ions and formaldehyde as the reducing agent on a ruthenium barrier layer (Example 6 (invention)).

The $S_Q$ value obtained was 24.0 nm from the scanning atomic force microscope scan shown in FIG. 11.

Example 7 (Invention)

Copper was deposited onto a silicon wafer comprising a cobalt barrier. The sole source of hydroxide ions in the copper plating bath was CsOH and the reducing agent was glyoxylic acid.

Figure 12:
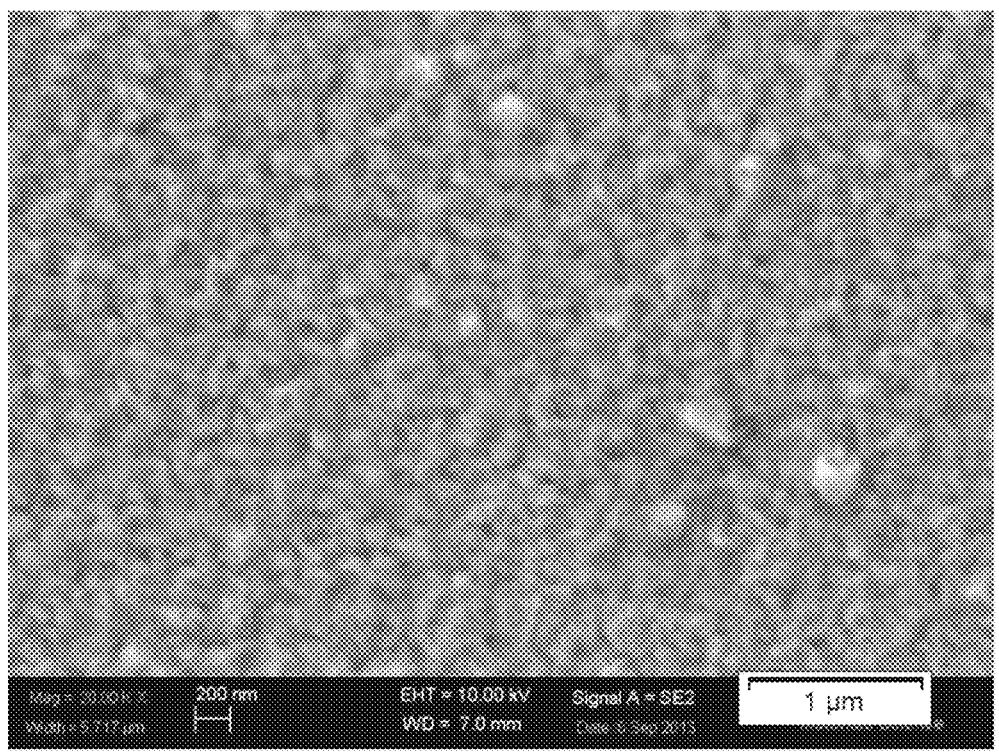
FIG. 12 shows a scanning electron micrograph of a copper seed layer obtained from an electroless plating bath containing CsOH as the sole source for hydroxide ions and glyoxylic acid as the reducing agent on a cobalt barrier layer (Example 7 (invention)).

A scanning electron micrograph of the copper seed layer outer surface is shown in FIG. 12.

Example 8 (Comparative)

Copper was deposited onto a silicon wafer comprising a ruthenium barrier layer after reduction of the surface oxides. The sole source of hydroxide ions in the copper plating bath was tetramethylammonium hydroxide and the reducing agent was glyoxylic acid (example in accordance with US 2004/0152303 A1).

Figure 13:
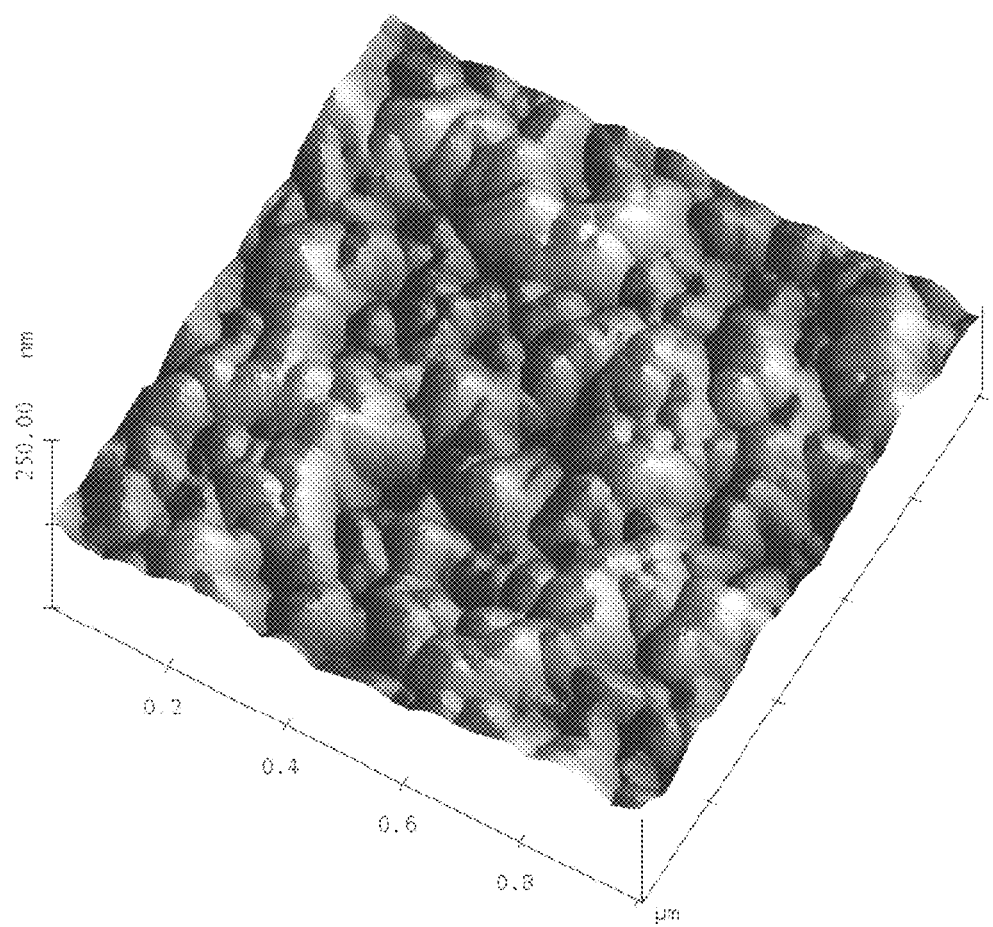
FIG. 13 shows a scanning atomic force microscope (AFM) image of a copper seed layer obtained from an electroless plating bath containing tetramethylammonium hydroxide as the sole source for hydroxide ions and glyoxylic acid as the reducing agent on a ruthenium barrier layer (Example 8 (comparative)).

The $S_Q$ value obtained was 9.3 nm from the scanning atomic force microscope scan shown in FIG. 13.

Example 9 (Comparative)

Copper was deposited onto a silicon wafer comprising a ruthenium barrier layer after reduction of the surface oxides. The sole source of hydroxide ions in the copper plating bath was tetrabutylammonium hydroxide and the reducing agent was glyoxylic acid.

Figure 14:
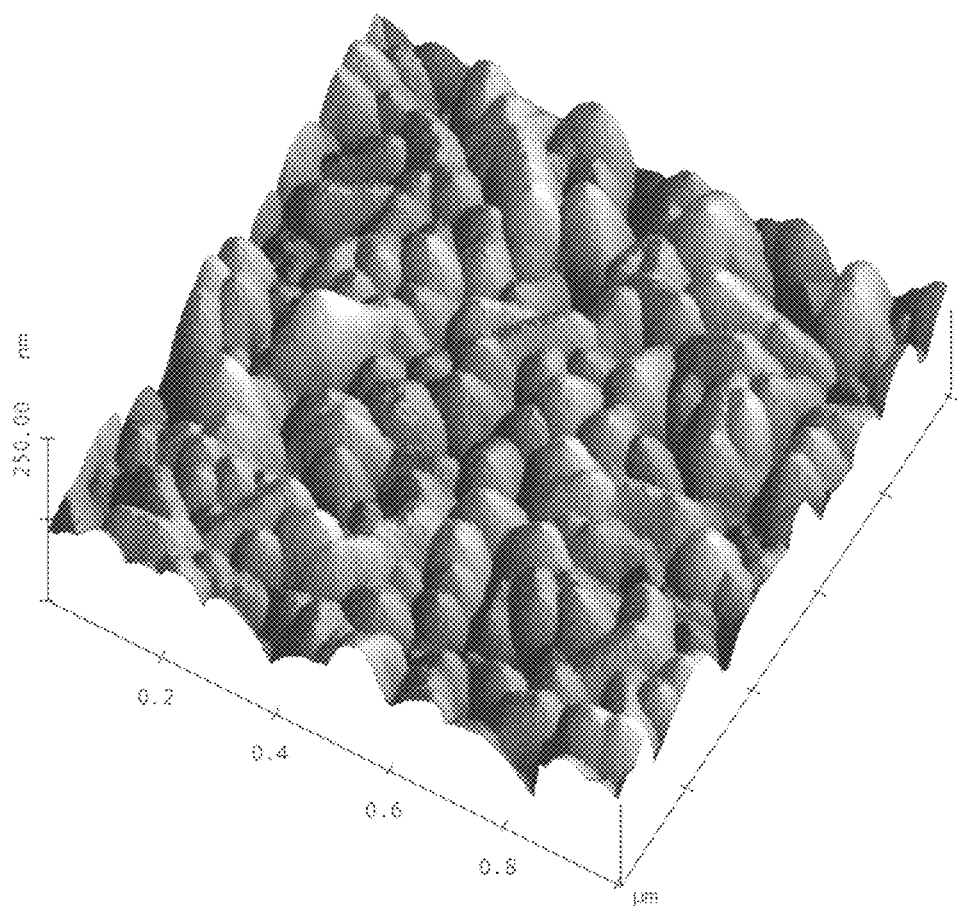
FIG. 14 shows a scanning atomic force microscope (AFM) image of a copper seed layer obtained from an electroless plating bath containing tetrabutylammonium hydroxide as the sole source for hydroxide ions and glyoxylic acid as the reducing agent on a ruthenium barrier layer (Example 9 (comparative)).

The $S_Q$ value obtained was 20.07 nm from the scanning atomic force microscope scan shown in FIG. 14.

The invention claimed is:

1. A method for providing a copper seed layer on top of a barrier layer comprising, in this order, the steps of
   (i) providing a substrate comprising at least on a portion of the outer surface a barrier layer selected from the group consisting of cobalt, nickel, ruthenium, tungsten, tantalum, titanium, iridium, rhodium and alloys of the aforementioned,
   (ii) contacting said substrate with an aqueous electroless copper plating bath, being substantially free of $Na^+$, $K^+$ and tetraalkylammonium ions, which comprises
      a. a water-soluble source for Cu(II) ions,
      b. a reducing agent for Cu(II) ions selected from the group consisting of formaldehyde, glyoxylic acid, and mixtures thereof,
      c. at least one complexing agent for Cu(II) ions and
      d. at least one source for hydroxide ions selected from the group consisting of RbOH, CsOH and mixtures thereof.

2. The method for providing a copper seed layer on top of a barrier layer according to claim 1 wherein the substrate material is selected from the group consisting of silicon, a low-κ-dielectric material on a silicon substrate and glass.

3. The method for providing a copper seed layer on top of a barrier layer according to claim 1 wherein the barrier layer is selected from the group consisting of cobalt, nickel, ruthenium and alloys of the aforementioned.

4. The method for providing a copper seed layer on top of a barrier layer according to claim 1 wherein the reducing agent in the electroless copper plating bath utilized in step (ii) is glyoxylic acid.

5. The method for providing a copper seed layer on top of a barrier layer according to claim 1 wherein the complexing agent for Cu(II) ions in the electroless copper plating bath utilized in step (ii) is selected from the group consisting of carboxylic acids, hydroxycarboxylic acids, aminocarboxylic acids, alkanolamines, polyols and mixtures thereof.

6. The method for providing a copper seed layer on top of a barrier layer according to claim 1 wherein the electroless copper plating bath utilized in step (ii) further comprises a wetting-agent selected from cationic wetting agents, anionic wetting agents, non-ionic wetting agents, amphoteric wetting agents and mixtures thereof.

7. The method for providing a copper seed layer on top of a barrier layer according to claim 1 wherein the electroless copper plating bath utilized in step (ii) further comprises a wetting agent selected from the group consisting of polyethyleneglycol, polypropyleneglycol, polyethyleneglycol-polypropyleneglycol co-polymers, alcohol alkoxylates, alkoxylated fatty acid and mixtures thereof.

8. The method for providing a copper seed layer on top of a barrier layer according to claim 6 wherein the concentration of the wetting agent in the electroless copper plating bath utilized in step (ii) ranges from 0.1 to 100 g/l.

9. The method for providing a copper seed layer on top of a barrier layer according to claim 1 wherein the barrier layer is ruthenium and the means for reducing surface oxides prior to step (ii) is selected from the group consisting of treatment with a $N_2/H_2$ plasma and treatment with a reducing agent provided in a solvent.

10. The method for providing a copper seed layer on top of a barrier layer according to claim 9 wherein the reducing agent provided in a solvent is selected from the group consisting of in situ generation of nascent hydrogen by applying a cathodic electrical voltage to the solvent, glyoxylic acid, formaldehyde, hypophosphite, hydrazine, dimethylamino borane, trimethylamino borane, N-methylmorpholino borane and sodium borohydride.

11. The method for providing a copper seed layer on top of a barrier layer according to claim 9 wherein the solvent is selected from the group consisting of water, alcohols, glycol ethers and mixtures thereof.

12. The method for providing a copper seed layer on top of a barrier layer according to claim 1 wherein oxygen gas is directed through the electrolyte before copper plating and an inert gas is directed through the electroless plating bath during step (ii).

13. The method for providing a copper seed layer on top of a barrier layer according to claim 10 wherein the solvent is selected from the group consisting of water, alcohols, glycol ethers and mixtures thereof.

14. The method for providing a copper seed layer on top of a barrier layer according to claim 1 further comprising one or more additional step to produce an electronic device comprising the substrate, the barrier layer and the copper seed layer.

15. The method for providing a copper seed layer on top of a barrier layer according to claim 1 wherein the source for hydroxide ions is CsOH.

16. A method for providing a copper seed layer on top of a barrier layer comprising, in this order, the steps of
(i) providing a substrate comprising at least on a portion of the outer surface a barrier layer selected from the group consisting of cobalt, nickel, ruthenium, and alloys of the aforementioned,
(ii) contacting said substrate with an aqueous electroless copper plating bath, being substantially free of Na+, K+, and tetraalkylammonium ions, which comprises
a. a water-soluble source for Cu(II) ions,
b. glyoxylic acid as reducing agent for Cu(II) ions,
c. at least one complexing agent for Cu(II) ions, and
d. CsOH as source for hydroxide ions.

17. A method for providing a copper seed layer on top of a barrier layer comprising, in this order, the steps of
(i) providing a substrate comprising at least on a portion of the outer surface a barrier layer selected from the group consisting of cobalt, ruthenium, and alloys of the aforementioned,
(ii) contacting said substrate with an aqueous electroless copper plating bath, being substantially free of Na+, K+, and tetraalkylammonium ions, which comprises
a. a water-soluble source for Cu(II) ions,
b. a reducing agent for Cu(II) ions selected from the group consisting of formaldehyde, glyoxylic acid, and mixtures thereof,
c. at least one complexing agent for Cu(II) ions and
d. at least one source for hydroxide ions selected from the group consisting of RbOH, CsOH and mixtures thereof.

18. The method for providing a copper seed layer on top of a barrier layer according to claim 17 wherein the reducing agent in the electroless copper plating bath utilized in step (ii) is glyoxylic acid.

19. The method for providing a copper seed layer on top of a barrier layer according to claim 17 wherein the at least one source for hydroxide ions is CsOH.

20. The method for providing a copper seed layer on top of a barrier layer according to claim 17 wherein the complexing agent for Cu(II) ions in the electroless copper plating bath utilized in step (ii) is selected from the group consisting of carboxylic acids, hydroxycarboxylic acids, aminocarboxylic acids, alkanolamines, polyols and mixtures thereof.

21. The method for providing a copper seed layer on top of a barrier layer according to claim 1 wherein the barrier layer is selected from the group consisting of cobalt, nickel, ruthenium, and alloys of the aforementioned, and wherein the reducing agent in the electroless copper plating bath utilized in step (ii) is glyoxylic acid.

22. The method according to claim 1, wherein the barrier layer is disposed in a recess in the substrate, and step (ii) is carried out for a time sufficient to fill the recess with copper.

23. The method according to claim 16, wherein the barrier layer is disposed in a recess in the substrate, and step (ii) is carried out for a time sufficient to fill the recess with copper.

24. The method according to claim 17, wherein the barrier layer is disposed in a recess in the substrate, and step (ii) is carried out for a time sufficient to fill the recess with copper.

* * * * *